(12) United States Patent
Konishi et al.

(10) Patent No.: US 10,916,667 B2
(45) Date of Patent: Feb. 9, 2021

(54) SOLAR CELL AND PRODUCTION METHOD THEREFOR, AND SOLAR CELL MODULE

(71) Applicant: KANEKA CORPORATION, Osaka (JP)

(72) Inventors: Katsunori Konishi, Osaka (JP); Kunihiro Nakano, Osaka (JP); Hayato Kawasaki, Osaka (JP); Kunta Yoshikawa, Osaka (JP)

(73) Assignee: KANEKA CORPORATION, Osaka (JP)

( * ) Notice: Subject to any disclaimer, the term of this patent is extended or adjusted under 35 U.S.C. 154(b) by 48 days.

(21) Appl. No.: 16/221,076

(22) Filed: Dec. 14, 2018

(65) Prior Publication Data

US 2019/0123221 A1 Apr. 25, 2019

Related U.S. Application Data

(63) Continuation of application No. PCT/JP2017/019851, filed on May 29, 2017.

(30) Foreign Application Priority Data

Jun. 15, 2016 (JP) .................. 2016-119309

(51) Int. Cl.
*H01L 31/0224* (2006.01)
*H01L 31/0747* (2012.01)
(Continued)

(52) U.S. Cl.
CPC .. *H01L 31/022425* (2013.01); *H01L 31/0224* (2013.01); *H01L 31/022466* (2013.01);
(Continued)

(58) Field of Classification Search
CPC ......... H01L 31/0224; H01L 31/022466; H01L 31/022441; H01L 31/022425; H01L 31/048; H01L 31/0747; H01L 31/1884
See application file for complete search history.

(56) References Cited

U.S. PATENT DOCUMENTS

2009/0223562 A1* 9/2009 Niira ............... H01L 31/022441
136/256
2015/0093851 A1 4/2015 Tu
(Continued)

FOREIGN PATENT DOCUMENTS

| JP | 2010-108994 A | 5/2010 |
| WO | 2008/050889 A1 | 5/2008 |
| WO | 2015/183761 A1 | 12/2015 |

OTHER PUBLICATIONS

Extended European Search Report issued in European Application No. 17813121.5, dated Jan. 15, 2020 (8 pages).
(Continued)

*Primary Examiner* — Mayla Gonzalez Ramos
(74) *Attorney, Agent, or Firm* — Osha Bergman Watanabe & Burton LLP

(57) ABSTRACT

A solar cell includes a semiconductor substrate, a first conductive layer, a second conductive layer, a first electrode, a second electrode, and an island-shaped conductive layer. The first conductive layer and the second conductive layer are disposed on one principal surface of the semiconductor substrate. The first electrode is disposed on the first conductive layer and the second electrode is disposed on the second conductive layer. The first electrode and the second electrode are electrically separated, and the island-shaped conductive layer is disposed between the first electrode and the second electrode.

6 Claims, 5 Drawing Sheets

(51) Int. Cl.
    *H01L 31/048*    (2014.01)
    *H01L 31/18*    (2006.01)
(52) U.S. Cl.
    CPC ........ *H01L 31/048* (2013.01); *H01L 31/0747* (2013.01); *H01L 31/1884* (2013.01); *Y02E 10/50* (2013.01)

(56) References Cited

U.S. PATENT DOCUMENTS

2015/0349154 A1* 12/2015 Harley ............ H01L 31/022433
                                                        136/256
2015/0349155 A1   12/2015 Kim et al.

OTHER PUBLICATIONS

International Search Report issued in International Application No. PCT/JP2017/019851, dated Jul. 18, 2017 (2 pages).
Written Opinion issued in International Application No. PCT/JP2017/019851, dated Jul. 18, 2017 (3 pages).

* cited by examiner

SOLAR CELL AND PRODUCTION METHOD THEREFOR, AND SOLAR CELL MODULE

TECHNICAL FIELD

One or more embodiments of the present invention relate to a solar cell, a method for manufacturing the solar cell, and a solar cell module including the solar cell.

BACKGROUND

A solar cell including a semiconductor substrate has high photoelectric conversion efficiency. Such a solar cell has already been widely used as a photovoltaic power generation system. Many solar cells that are currently on the market are double-sided electrode type solar cells. To draw a current efficiently, a double-sided electrode type solar cell has two electrodes on both sides, i.e., the light receiving side for sunlight and the back side opposite to the light receiving side. More specifically, the double-sided electrode type solar cell has electrodes on both surfaces of a semiconductor substrate, respectively. With this configuration, when sunlight is incident on the light receiving surface, an electron-hole pair is created in the solar cell, and then a current is drawn through the electrodes on both surfaces.

However, in the double-sided electrode type solar cell, the electrode is provided on the light receiving surface as well as the back surface to draw a current efficiently. The electrode on the light receiving surface can block the sunlight and reduce the photoelectric conversion efficiency. Therefore, a back-surface electrode type solar cell has been proposed. The back-surface electrode type solar cell includes a p-type semiconductor layer and an n-type semiconductor layer that are formed on the back surface of a semiconductor substrate, and electrodes provided on these semiconductor layers. Since there is no need to provide an electrode on the light receiving surface, the back-surface electrode type solar cell can improve the light receiving rate of sunlight and achieve higher photoelectric conversion efficiency.

In the back-surface electrode type solar cell, the p-type semiconductor layer and the n-type semiconductor layer should be formed on the back side of the semiconductor substrate, and electrodes should be formed on the p-type semiconductor layer and the n-type semiconductor layer. Thus, the manufacturing method of the back-surface electrode type solar cell is complicated, and this may deteriorate the performance of the solar cell during the manufacture of the solar cell.

For example, Patent Document 1 proposes a method for manufacturing a back-surface electrode type solar cell that includes: electrically connecting a plurality of conductive regions; forming collection electrodes by a plating method; and forming separation grooves between the plurality of conductive regions to electrically separate the collection electrodes. Moreover, Patent Document 1 indicates that, by covering portions that are exposed at the time of forming the separation grooves with an insulating layer, cracks or the like in the vicinity of the separation grooves can be prevented.

PATENT DOCUMENT

Patent Document 1: JP 2010-108994 A

However, it has been found that, if a solar cell module is manufactured using the solar cells including separation grooves as disclosed in Patent Document 1, the lifetime of carries is lowered in the vicinity of the separation groves. The reason for this is as follows. A sealing material used in the manufacture of the solar cell module contacts semiconductor conductive layers directly or via the insulating layer in the vicinity of the separation grooves, thus impurities in the sealing material are diffused into the semiconductor conductive layers, and leakage current occurs between the semiconductor conductive layers.

SUMMARY

One or more embodiments of the present invention provide a solar cell of a back-surface electrode type having improved open circuit voltage and fill factor while reducing the shortening of the lifetime of carriers, a method for manufacturing the solar cell, and a solar cell module including the solar cell.

A solar cell of one or more embodiments of the present invention includes: a semiconductor substrate; and a first conductive layer and a second conductive layer that are disposed on one principal surface of the semiconductor substrate. A first electrode is disposed on the first conductive layer, and a second electrode is disposed on the second conductive layer. The first electrode and the second electrode are electrically separated, and an island-shaped conductive layer is disposed between the first electrode and the second electrode.

A solar cell module of one or more embodiments of the present invention includes a plurality of the solar cells of one or more embodiments of the present invention. The solar cell module further includes a sealing layer that covers the solar cell, a wiring part, a light receiving surface protective layer, and a back surface protective layer.

A method for manufacturing the solar cell of one or more embodiments of the present invention includes: a conductive layer formation step of forming a first conductive layer and a second conductive layer on one principal surface of a semiconductor substrate; and an electrode formation step of forming a first electrode on the first conductive layer and a second electrode on the second conductive layer. In the electrode formation step, an island-shaped conductive layer is formed between the first electrode and the second electrode.

One or more embodiments of the present invention can provide a solar cell and a solar cell module with improved open circuit voltage and fill factor.

DETAILED DESCRIPTION OF THE EMBODIMENTS (Solar Cell)

The following describes a solar cell of one or more embodiments of the present invention. A solar cell of one or more embodiments includes a semiconductor substrate, and a first conductive layer and a second conductive layer that are disposed on one principal surface of the semiconductor substrate. A first electrode is disposed on the first conductive layer, and a second electrode is disposed on the second conductive layer. The first electrode and the second electrode are electrically separated. An island-shaped conductive layer is disposed between the first electrode and the second electrode.

In the solar cell of one or more embodiments, the island-shaped conductive layer is disposed between the first electrode and the second electrode. Thereby, when a solar cell module is manufactured using the solar cells of one or more embodiments, the shortening of the lifetime of carriers can be reduced, and the open circuit voltage and the fill factor can be improved as compared with conventional back-surface electrode type solar cells. In other words, when a solar cell module is manufactured using the solar cells of one or more embodiments, the island-shaped conductive layer functions as a shielding layer while keeping electrical insulation properties between the semiconductor conductive layers, thereby protecting the semiconductor conductive layers from various substances that may shorten the lifetime of carriers. More specifically, the island-shaped conductive layer avoids the sealing material of the solar cell module from contacting the semiconductor conductive layers directly, thereby reducing the diffusion of impurities in the sealing material into the semiconductor conductive layers, and preventing the occurrence of leakage current between the semiconductor conductive layers. Further, the island-shaped conductive layer functions as a shielding layer, thereby preventing the semiconductor conductive layers from coming into contact with impurities such as vapor and metal materials during the manufacturing process of the solar cell module, and reducing the diffusion of the impurities into the semiconductor conductive layers.

Further, in one or more embodiments, the island-shaped conductive layer improves adherence between the sealing material of the solar cell module and the solar cells, thereby improving the reliability of the solar cell module. Moreover, the island-shaped conductive layer can reduce the occurrence of electrostatic destruction in the manufacturing process of the solar cells, thereby improving the production efficiency of the solar cells.

Figure 1:
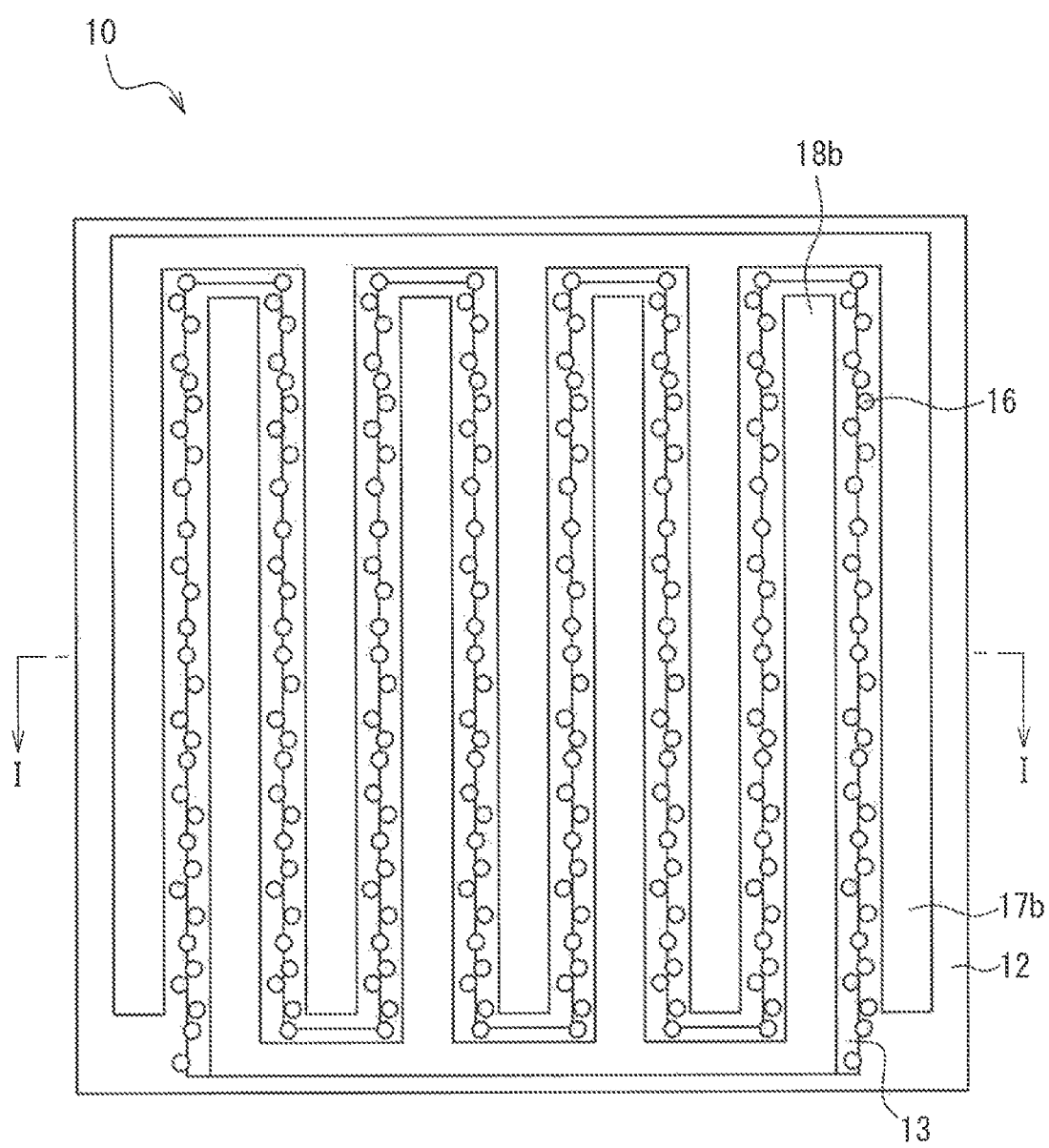
FIG. 1 is a schematic plan view illustrating an exemplary solar cell of one or more embodiments of the present invention.
Figure 2:
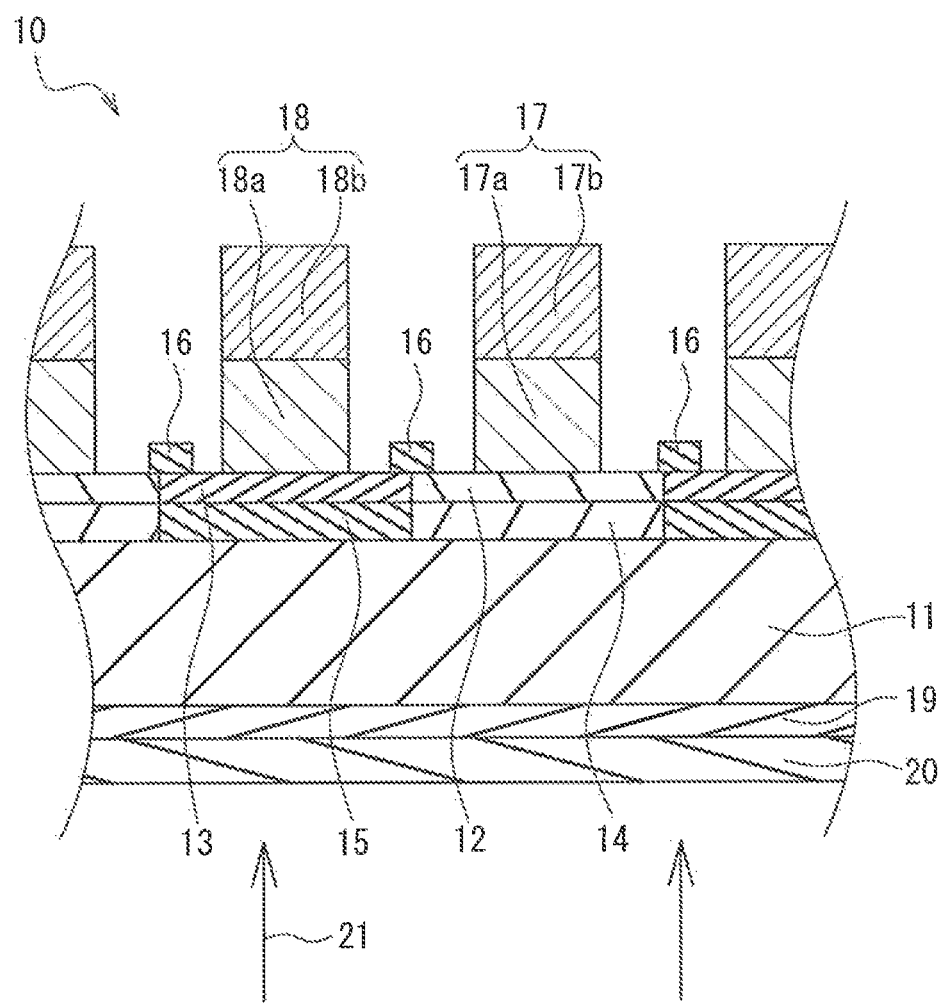
FIG. 2 is a schematic cross-sectional view illustrating the main portion of the solar cell of one or more embodiments of the present invention, taken along a line I-I in FIG. 1.

Next, the solar cell of one or more embodiments will be described with reference to the drawings. FIG. 1 is a schematic plan view illustrating an exemplary solar cell of one or more embodiments, and FIG. 2 is a schematic cross-sectional view illustrating the main portion of the solar cell, taken along a line I-I in FIG. 1. Although a heterojunction solar cell is illustrated in FIGS. 1 and 2, the solar cell of one or more embodiments is not limited thereto and may be a homojunction solar cell.

In FIGS. 1 and 2, a solar cell 10 of one or more embodiments includes a semiconductor substrate 11, and a first conductive layer 12 and a second conductive layer 13 that are disposed on one principal surface (back surface) of the semiconductor substrate 11. A junction layer 14 is disposed between the first conductive layer 12 and the semiconductor substrate 11, and a junction layer 15 is disposed between the second conductive layer 13 and the semiconductor substrate 11.

In one or more embodiments a first electrode 17 is disposed on the first conductive layer 12, and a second electrode 18 is disposed on the second conductive layer 13. The first electrode 17 and the second electrode 18 are electrically separated. The first electrode 17 includes a first lower electrode 17a that is in contact with the first conductive layer 12 and a first upper electrode 17b that is disposed on the first lower electrode 17a. The second electrode 18 includes a second lower electrode 18a that is in contact with the second conductive layer 13 and a second upper electrode 18b that is disposed on the second lower electrode 18a.

In one or more embodiments an island-shaped conductive layer 16 is disposed between the first electrode 17 and the second electrode 18. The arrangement position of the island-shaped conductive layer 16 is not particularly limited as long as it is disposed between the first electrode 17 and the second electrode 18. For example, the island-shaped conductive layer 16 may be on the first conductive layer 12, or on the second conductive layer 13, or on a position across the first conductive layer 12 and the second conductive layer 13.

In one or more embodiments the solar cell 10 further includes a junction layer 19 and an antireflection layer 20 on the other principal surface (light receiving surface) of the semiconductor substrate 11. The solar cell 10 receives sunlight 21 from the light receiving surface. The solar cell 10 is a back-surface electrode type solar cell in which no electrode is formed on the light receiving side. Therefore, nothing blocks the sunlight from reaching the light receiving surface, so that the photoelectric conversion efficiency is improved.

Next, the constituent members of the solar cell of one or more embodiments will be described by exemplifying a heterojunction silicon solar cell. In the following description, a numerical range "A-B" means "A or more and B or less".

<Semiconductor Substrate>

In one or more embodiments the semiconductor substrate 11 may be a conductive monocrystalline silicon substrate or a conductive polycrystalline silicon substrate. The use of the conductive monocrystalline silicon substrate can achieve higher photoelectric conversion efficiency. The use of the conductive polycrystalline silicon substrate can produce a solar cell at a lower cost.

In the case of using the conductive monocrystalline silicon substrate as the semiconductor substrate 11 of one or more embodiments, the conductive monocrystalline silicon substrate may be an n-type monocrystalline silicon substrate or a p-type monocrystalline silicon substrate. From the viewpoint of the lifetime of carriers in the crystalline silicon substrate, an n-type monocrystalline silicon substrate may be preferred. This is because the p-type monocrystalline silicon substrate may cause LID (light induced degradation), which is a phenomenon in which B (boron) as a p-type dopant is affected by light irradiation and forms recombination centers, while the n-type monocrystalline silicon substrate can further reduce the occurrence of LID.

In the case of using the conductive monocrystalline silicon substrate as the semiconductor substrate 11 of one or more embodiments, the thickness of the conductive monocrystalline silicon substrate may be preferably 50-250 µm, more preferably 60-200 µm, and further preferably 70-180 µm. The material cost can be reduced further by using a substrate having a thickness within this range. The conductive monocrystalline silicon substrate may have a rugged structure called a textured structure on the light incidence side, from the viewpoint of improving light trapping.

<Conductive Layer>

In one or more embodiments, the first conductive layer 12 may be a conductive silicon layer, and the second conductive layer 13 may be a conductive silicon layer that has a different conductivity type from the first conductive layer 12. The conductive silicon layer may be a p-type silicon layer or an n-type silicon layer. B (boron) may be preferably used as a dopant impurity of the p-type silicon layer, and P (phosphorus) may be preferably used as a dopant impurity of the n-type silicon layer.

The conductive silicon layer may be an amorphous silicon layer or a microcrystalline silicon layer that includes amorphous silicon and crystalline silicon.

In one or more embodiments, the method for forming the conductive silicon layer is not particularly limited, but preferably the method may be a CVD method. In this case, the material gas is $SiH_4$ gas, and the dopant additive gas may be preferably $B_2H_6$, or $PH_3$ that is diluted with hydrogen. Further, a minute amount of an impurity such as oxygen or carbon may be added to improve light transmittance. In this case, gas such as $CO_2$ or $CH_4$ may be introduced during the formation of a CVD film.

In the back-surface electrode type solar cell, light is incident from the incidence surface side, and generated carriers are collected on the back surface. Because of this, the first conductive layer 12 and the second conductive layer 13 are formed in the same plane. The method for forming the first conductive layer 12 and the second conductive layer 13 in the same plane may be a CVD method or etching using a mask.

<Junction Layer>

In one or more embodiments, the junction layer 14 and the junction layer 15 may be intrinsic silicon layers. The junction layer 14 and the junction layer 15 function as passivation layers and prevent recombination of carriers.

<Electrode>

In one or more embodiments, the first lower electrode 17a and the first upper electrode 17b of the first electrode 17 and the second lower electrode 18a and the second upper electrode 18b of the second electrode 18 may be made of a metal material or a transparent conductive material. In order to simplify the manufacturing process, it may be preferred that the first lower electrode 17a and the second lower electrode 18a are made of the same material, and the first upper electrode 17b and the second upper electrode 18b are made of the same material.

Examples of the metal material include Cu, Ag, Al, and alloys thereof. Examples of the transparent conductive material include transparent conductive metal oxides such as indium oxide, tin oxide, zinc oxide, titanium oxide, and composite oxides thereof. Among them, indium-based composite oxide composed mainly of indium oxide may be preferred. From the viewpoint of high conductivity and transparency indium oxide may be particularly preferred. Moreover, in order to obtain reliability and higher conductivity indium oxide with a dopant may be further preferred. Examples of the dopant include Sn, W, Zn, Ti, Ce, Zr, Mo, Al, Ga, Ge, As, Si, and S.

In one or more embodiments, the first electrode 17 and the second electrode 18 are formed as electrodes having a two-layer structure. However, the electrodes may be formed as electrodes having a single-layer structure, or electrodes having a multilayer structure including three or more layers. In the case of forming the first electrode 17 and the second electrode 18 as electrodes having a single-layer structure, it may be preferred that the first electrode 17 and the second electrode 18 are made of the same material to simplify the manufacturing process.

The method for forming the electrodes of one or more embodiments is not particularly limited. In the case of forming the electrodes from the metal material, for example, screen printing, plating, a wire bonding method, an inkjet method, spraying, a vacuum evaporation method, or sputtering may be used. In one or more embodiments, screen printing using an Ag paste and plating using a copper plating are preferred.

In the case of forming the electrodes using the transparent conductive material for example, a physical vapor phase deposition method such as sputtering or a chemical vapor phase deposition method using the reaction between an organometallic compound and oxygen or water may be used.

<Island-Shaped Conductive Layer>

The term "island-shaped" in one or more embodiments refers to, as is commonly used in the field of the thin film formation technology: three-dimensional island-shaped growth (Volmer-Weber type) that can be observed in an initial growth stage of thin film crystal; an island-shaped structure that is formed on a rugged structure by an oblique evaporation method; or an island-shaped structure in which part of a thin film layer remains after removal of the thin film layer by etching. In other words, the island-shaped conductive layers refer to a state in which conductive layers are present at intervals.

In one or more embodiments the shape of the island-shaped conductive layer 16 is not particularly limited. However, from the viewpoint of reducing leakage current, the island-shaped conductive layer 16 is required to have a shape that is not spatially continuous in a region where the first electrode 17 and the second electrode 18 are spaced apart from each other. A required sheet resistance of the island-shaped conductive layer 16 varies depending on the width of the spaced region between the first electrode 17 and the second electrode 18. In order to keep insulation properties between the first electrode 17 and the second electrode 18, the sheet resistance may be preferably 1.6 kΩ/square or more. The sheet resistance of the conductive layer 16 can be controlled by adjusting the thickness of the conductive layer 16.

Figure 3A:
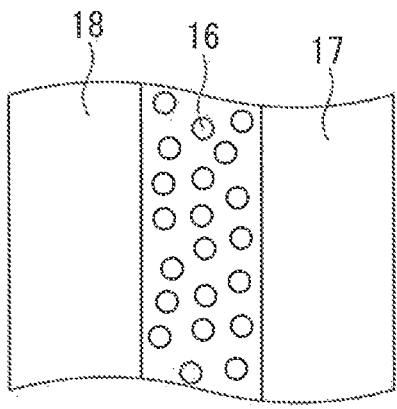
FIGS. 3A-3D are schematic plan views of one or more embodiments of the present invention, illustrating the main portion of exemplary shape patterns of island-shaped conductive layers disposed between electrodes.
Figure 3B:
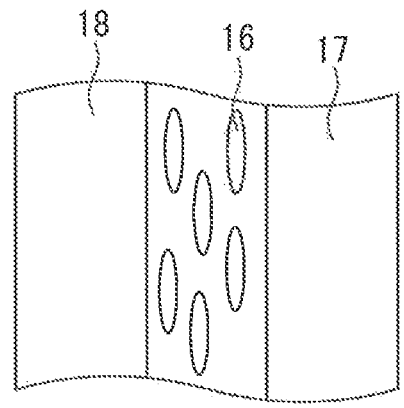
Figure 3C:
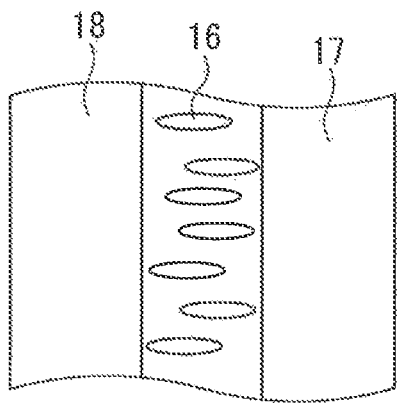
Figure 3D:
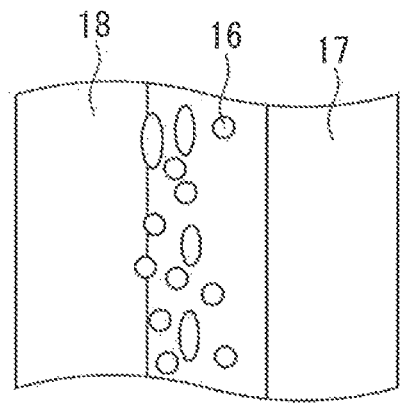

FIGS. 3A to 3D illustrate exemplary shape patterns of the island-shaped conductive layers 16 that are disposed between the first electrode 17 and the second electrode 18. The shape of the island-shaped conductive layer 16 may be circular as illustrated in FIG. 3A, or may extend in a direction parallel to or vertical to the electrodes as illustrated in FIG. 3B or 3C. The island shape of the conductive layer 16 is not particularly limited as long as the conductive layer 16 does not bridge the first electrode 17 and the second electrode 18, which means that the conductive layer 16 is isolated from both of the first electrode 17 and the second electrode 18, or even if the conductive layer 16 is in contact with one of the electrodes, the conductive layer 16 is separated from the other electrode. Moreover, as illustrated in FIG. 3D, the island-shaped conductive layers 16 of various shapes may be present together and part of the conductive layers may be formed on the electrodes. Moreover, it is unnecessary for the island-shaped conductive layers 16 to be uniformly distributed in the spaced region between the first electrode 17 and the second electrode 18.

In one or more embodiments a maximum width of the conductive layer 16 in a separation direction of the first electrode 17 and the second electrode 18 may be preferably 50 nm or more and 250 nm or less. If the maximum width of the conductive layer 16 is too large, the conductive layer 16 will bridge the first electrode 17 and the second electrode 18, which deteriorates insulation properties between the first electrode 17 and the second electrode 18 when the sheet resistance of the conductive layer 16 is low.

In one or more embodiments a coverage area ratio of the island-shaped conductive layers 16 on the spaced region between the first electrode 17 and the second electrode 18 is not particularly limited, but preferably, the ratio may be 30-70% from the viewpoint of reducing the leakage current and reducing the shortening of the lifetime of carriers.

In one or more embodiments although the island-shaped conductive layer 16 can be made of the same conductive material as the material for forming the electrodes described above, the island-shaped conductive layer 16 may be made of a different conductive material from the material for forming the electrodes. It may be preferred that the material for forming the island-shaped conductive layer 16 has a bulk resistance of $1 \times 10^{-3}$ Ωcm or less.

In one or more embodiments the metal material as the material for forming the island-shaped conductive layer 16 may be, e.g., Cu, Ag, Al, or an alloy thereof. The transparent conductive material as the material for forming the island-shaped conductive layer 16 may be preferably a material that contains indium oxide as a main component and at least one selected from the group consisting of Sn, W, Zn, Ti, Ce, Zr, Mo, Al, Ga and Ge as a dopant. In order to simplify the manufacturing process, it may be preferable to use the transparent conductive material as the material for forming the island-shaped conductive layer 16.

In one or more embodiments the island-shaped conductive layer 16 may have a single-layer structure or a multilayer structure. When the island-shaped conductive layer 16 has a multilayer structure, specifically the multilayer structure may be composed of e.g., a metal layer and a metal layer; a transparent conductive layer and a metal layer; or a transparent conductive layer and a transparent conductive layer.

Moreover, in one or more embodiments an insulating layer, and a first conductive semiconductor layer or a second conductive semiconductor layer may be formed on or formed to cover the island-shaped conductive layer 16. The insulating layer may be, e.g., an intrinsic silicon layer, a silicon oxide layer, or a silicon nitride layer. The insulating layer is not particularly limited thereto as long as it is an electrically insulating layer.

The following describes the method of one or more embodiments for forming the island-shaped conductive layer per each formation mode.

[Formation Mode 1 (when the Island-Shaped Conductive Layer is Made of Metal Material)]

In one or more embodiments, as the method for forming the island-shaped conductive layer from the metal material, a sol-gel method or plating may be adopted, but preferably the method may be a vapor phase method such as sputtering or a vacuum evaporation method from the viewpoint of controlling the thickness of the island-shaped conductive layer. In the case of forming the island-shaped conductive layer by the vapor phase method, the temperature of the substrate is desirably as low as room temperature, and further desirably lower than room temperature by cooling. This can prevent the metal material flown from an evaporation source from diffusing on the cell surface due to migration and prevent a heat history from being given to the solar cell. Among the vapor phase methods, the vacuum evaporation method may be more preferable than sputtering from the same reason.

In one or more embodiments, when the surface on the back side of the solar cell is uneven, an oblique evaporation method using a vacuum evaporation apparatus may be adopted to form the island-shaped conductive layer with high reproducibility. In the oblique evaporation method, the depressions of the rugged structure are shadowed by the projections of the rugged structure, and thus an evaporation material is less likely to adhere to the depressions directly.

Moreover the island-shaped conductive layer having regularity can be formed with higher reproducibility in one or more embodiments by forming the layer using a mask in the spaced region between the first electrode and the second electrode. However, because of the difficulty of the positioning of the mask, the oblique evaporation method is a simplest, highly reproducible method.

In one or more embodiments, it is desirable to adopt the oblique evaporation method utilizing the electrode portions as the projections, as the method for forming the metal thin film. In this case, the metal thin film by evaporation is formed on the electrode portions.

In one or more embodiments, it is preferred that the metal material for forming the island-shaped conductive layer of one or more embodiments has a bulk resistance of $1 \times 10^{-3}$ Ωcm or less. When the island-shaped conductive layer is made of the above metal material, electrostatic buildup can be prevented because of its high conductivity. Thus, the occurrence of electrostatic destruction during the manufacture of cells can be prevented, and the production efficiency of the solar cells can be improved.

[Formation Mode 2 (when the Island-Shaped Conductive Layer is Made of Transparent Conductive Material)]

In one or more embodiments, as the method for forming the island-shaped conductive layer from the transparent conductive material, the above oblique evaporation method may be adopted, but more preferably the method may be etching from the viewpoint of simplicity of process.

In the case of forming the island-shaped conductive layer by etching, first, a transparent conductive layer is formed on the first conductive layer and the second conductive layer by the vapor phase method using the transparent conductive material. Then, part of the transparent conductive layer is removed by etching in a boundary region between the first conductive layer and the second conductive layer. At this time, the concentration of the etchant and the etching time are adjusted so that part of the transparent conductive layer remains on the boundary region between the first conductive layer and the second conductive layer.

In one or more embodiments the transparent conductive layer separated by the etching may be used as it is as the first electrode and the second electrode. However, it may be preferable to form a metal electrode made of a metal material on the transparent conductive layer as a first upper electrode and a second upper electrode.

In one or more embodiments the method for manufacturing the metal electrode may be, e.g., screen printing, plating, a wire bonding method, an inkjet method, spraying, a vacuum evaporation method, or sputtering similarly to the method for forming the electrodes described above. In one or more embodiments, screen printing using an Ag paste and plating using a copper plating are preferred.

Although the above exemplifies one or more embodiments in which the transparent conductive layer is etched and thereafter the metal electrode is formed, the transparent conductive layer may be etched after formation of the metal electrode. In this case, it is desirable to select an etchant that does not etch the metal electrode and determine the concentration of the etchant.

In one or more embodiments, it is preferred that the transparent conductive material for forming the island-shaped conductive layer of one or more embodiments has a bulk resistance of $1-10^{-3}$ Ωcm or less. When the island-shaped conductive layer is made of the above transparent conductive material, electrostatic buildup can be prevented because of its high conductivity. Thus, the occurrence of electrostatic destruction during the manufacture of cells can be prevented, and the production efficiency of the solar cells can be improved.

[Formation Mode 3 (when the Island-Shaped Conductive Layer has a Multilayer Structure)]

In the formation modes 1 and 2 of one or more embodiments, the island-shaped conductive layer has a single-layer structure. However, the island-shaped conductive layer may have a multilayer structure. For example, the multilayer structure may be composed of a metal layer and a metal layer; a transparent conductive layer and a metal layer; or a transparent conductive layer and a transparent conductive layer.

As the method for forming the island-shaped conductive layer having a multilayer structure, etching may be adopted similarly to the formation mode 2. In this case, when the island-shaped conductive layer is a stack of a transparent conductive layer and a metal layer, the metal layer and the transparent conductive layer may be etched individually. However, from the viewpoint of simplicity of process, it may be preferable to select an etchant that enables etching of the entire stack simultaneously and adjust the concentration of the etchant and the etching time.

Next, a method for confirming the island shape of the conductive layer will be described. Whether the conductive layer has an island shape or not can be confirmed, e.g., by observation with a scanning electron microscope. The magnification of the observation is about 1000-100000×. The formed state of the conductive layer can be confirmed by observing a region including the spaced region between the first electrode and the second electrode in the back side of the solar cell.

In one or more embodiments, when the thickness of the conductive layer is very thin (1-20 nm), it is possible to observe the shape, e.g., in a transmission electron microscope. In this case, the magnification of the observation is about 100000-1000000×. The formed state of the conductive layer can be confirmed by observing a cross section including the spaced region between the first electrode and the second electrode.

Moreover the coverage ratio of the island-shaped conductive layers on the spaced region between the first electrode and the second electrode and the size of the island-shaped conductive layer can be confirmed using the same method as those described above.

In one or more embodiments, the sheet resistance of the island-shaped conductive layer may be evaluated, for example, by arranging a probe between the first electrode and the second electrode located next to the first electrode. Although the sheet resistance may be measured with a two-probe method in which one probe is arranged for each electrode, this method includes a contact resistance between the electrodes and the probes. Therefore, a four-probe method in which two probes are arranged for each electrode may be more preferred.

<Other Constituent Members>

The junction layer 19 that is formed on the light receiving surface of one or more embodiments may be made of an intrinsic silicon layer. The antireflection layer 20 may be preferably a light-transmissive film having a refractive index of about 1.5-2.3. The material for forming the antireflection layer 20 may be preferably SiO, SiN, or SiON. The method for forming the antireflection layer 20 is not particularly limited, but preferably the method may be a CVD method, which enables precise control of the film thickness. In the film formation by the CVD method, it is possible to control the film quality by controlling the material gas and the film formation conditions.

(Solar Cell Module)

Next, a solar cell module of one or more embodiments of the present invention will be described. The solar cell module of one or more embodiments includes a plurality of the solar cells of the above embodiments, a sealing layer that covers the solar cells, a wiring part a light receiving surface protective layer, and a back surface protective layer. In other words, the solar cell module of one or more embodiments is in the form of a module including a plurality of single solar cells, each of which includes a semiconductor substrate, and a first conductive layer and a second conductive layer that are disposed on one principal surface of the semiconductor substrate. The module can increase the light receiving area for sunlight and therefore can enhance the light receiving rate of sunlight.

Figure 4:
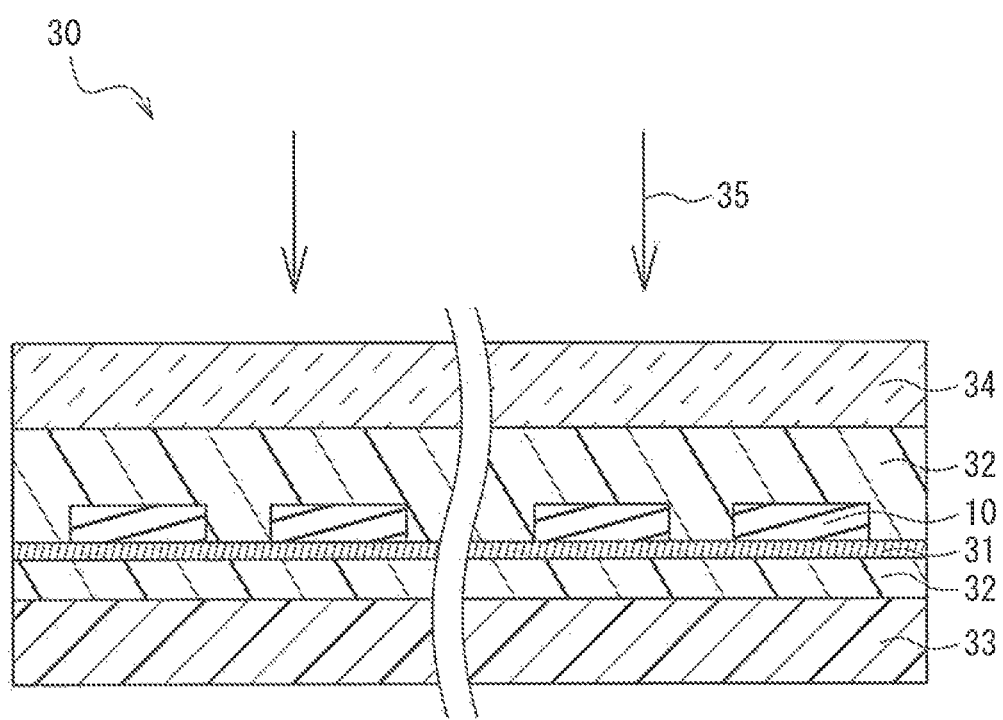
FIG. 4 is a schematic cross-sectional view illustrating the main portion of an exemplary solar cell module of one or more embodiments of the present invention.

FIG. 4 is a schematic cross-sectional view illustrating the main portion of an exemplary solar cell module of this embodiment. In FIG. 4, a solar cell module 30 of one or more embodiments includes a plurality of the solar cells 10 of the above embodiment. A wiring part 31 electrically connects the electrodes (not illustrated) of the solar cells 10 in series. A sealing layer 32 covers the solar cells 10 and the wiring part 31. A light receiving surface protective layer 34 is disposed on the light receiving side of the solar cells 10, and a back surface protective layer 33 is disposed on the back side of the solar cells 10. Sunlight 35 is incident from the light receiving surface protective layer 34.

In one or more embodiments, examples of the sealing material for forming the sealing layer 32 may include light-transmissive resins such as high density polyethylene (HDPE), high pressure low density polyethylene (LDPE), linear low density polyethylene (LLDPE), polypropylene (PP), an ethylene/α-olefin copolymer, an ethylene/vinyl acetate copolymer (EVA), ethylene/vinyl acetate/triallyl isocyanurate (EVAT), polyvinyl butyrate (PVB), silicone resin, urethane resin, acrylic resin, and epoxy resin. Among these, high density polyethylene (HDPE), high pressure low density polyethylene (LDPE), linear low density polyethylene (LLDPE), polypropylene (PP), and an ethylene/α-olefin copolymer may be more preferred from the viewpoint of preventing the entrance of moisture.

Since, in one or more embodiments, the sealing layer 32 covers the solar cells 10, the sealing material is in contact with the surfaces of the solar cells 10. The island-shaped conductive layers, which are disposed between the first electrodes and the second electrodes in the solar cells 10 as described above, avoid the sealing material from contacting the semiconductor conductive layers directly, thereby reducing the diffusion of impurities in the sealing material into the semiconductor conductive layers, and preventing the occurrence of leakage current between the semiconductor conductive layers. Further, the island-shaped conductive layers function as shielding layers, thereby preventing the semiconductor conductive layers from coming into contact with impurities such as vapor and metal materials during the manufacturing process of the solar cell module, and reducing the diffusion of the impurities into the semiconductor conductive layers. Moreover, the island-shaped conductive layers improve adherence between the sealing material of the solar cell module and the solar cells, thereby improving the reliability of the solar cell module. Moreover, the island-shaped conductive layers can reduce the occurrence of electrostatic destruction in the manufacturing process of the solar cells, thereby improving the production efficiency of the solar cells.

The wiring material constituting the wiring part 31 of one or more embodiments is not particularly limited, but preferably, the material may be a solder-coated copper foil in which the surface of a copper foil is coated with a solder, a silver-coated copper foil in which the surface of a copper foil that forms a rugged structure on the connection surface with the electrodes is coated with silver, etc. Such coating of the copper foil surface with a solder, silver, etc., can prevent the corrosion of the copper foil surface and improve electrical connection with the electrodes, and further, may provide an effect of improving electric current by light reflected at the wiring part 31.

In one or more embodiments, the light receiving surface protective layer 34 may be made of a light-transmissive member such as glass or transparent resin. The back surface protective layer 33 may be made of thermoplastic resin such as polyolefin resin, polyester resin, acrylic resin, fluorine resin, or ethylene-vinyl acetate resin. These resins may contain a colorant such as a pigment or dye.

(Method for Manufacturing Solar Cell)

Next, a method for manufacturing a solar cell of one or more embodiments of the present invention will be described. The method for manufacturing the solar cell of one or more embodiments includes: a conductive layer formation step of forming a first conductive layer and a second conductive layer on one principal surface of a semiconductor substrate; and an electrode formation step of forming a first electrode on the first conductive layer and a second electrode on the second conductive layer, wherein in the electrode formation step, an island-shaped conductive layer is formed between the first electrode and the second electrode.

In the method for manufacturing the solar cell of one or more embodiments, the formation of the electrodes and the formation of the island-shaped conductive layer can be performed substantially simultaneously in the electrode formation step, and thus a conventional process for manufacturing solar cells can be used substantially directly. In other words, it is unnecessary to add a new step to form the island-shaped conductive layer between the first electrode and the second electrode.

Next, an exemplary method for manufacturing the solar cell of one or more embodiments will be described based on the drawings. FIG. 5 is a schematic cross-sectional view illustrating the main portion of an exemplary manufacturing process of the solar cell of this embodiment. In FIG. 5, the members corresponding to those illustrated in FIG. 2 are denoted by the same reference numerals as in FIG. 2.

Figure 5A:
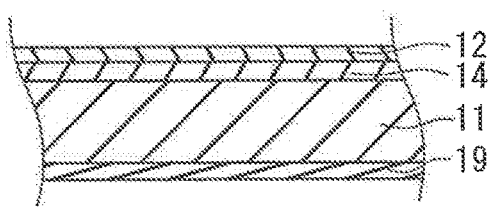
FIGS. 5A-5I are schematic cross-sectional views illustrating the main portion of an exemplary manufacturing process of a solar cell of one or more embodiments of the present invention.

First, as illustrated in FIG. 5A, an intrinsic silicon layer 19 is formed on the entire surface of the principal surface on the light receiving side of an n-type monocrystalline silicon substrate 11, and an intrinsic silicon layer 14 is formed on the entire surface of the principal surface on the back side of the n-type monocrystalline silicon substrate 11. The surface passivation effect can be expected by the formation of the intrinsic silicon layer 14. Although not illustrated in FIG. 5A, both principal surfaces of the n-type monocrystalline silicon substrate 11 have a textured structure from the viewpoint of improving the light capture efficiency due to the light trapping effect. Subsequently, a p-type silicon layer 12 is formed to substantially cover the intrinsic silicon layer 14.

In one or more embodiments, it is preferred that the intrinsic silicon layer 19, the intrinsic silicon layer 14, and the p-type silicon layer 12 are formed by a plasma CVD method. When the plasma CVD method is used to form the silicon layers, the film quality can be relatively easily controlled in accordance with the film formation conditions. This makes it easy to adjust the etchant resistance or the refractive index.

In one or more embodiments, preferred conditions for the formation of the silicon layers by the plasma CVD method are as follows: the substrate temperature is 100 to 300° C.; the pressure is 20 to 2600 Pa; and the high-frequency power density is 0.004 to 0.8 W/cm$^2$. The source gas used for forming the silicon layers may be preferably, e.g., silicon containing gas such as $SiH_4$ and $Si_2H_6$ or mixed gas of silicon-based gas and $H_2$. The dopant additive gas is $B_2H_6$.

Figure 5F:
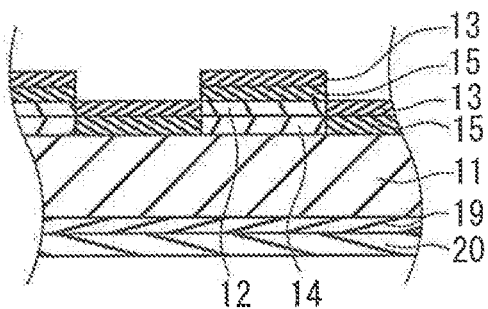
Figure 5B:
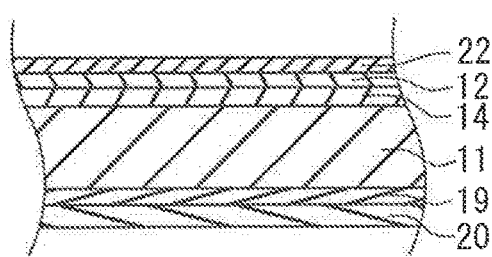

Next, as illustrated in FIG. 5B, an antireflection layer 20 is formed on the intrinsic silicon layer 19. The antireflection layer 20 may be preferably made of silicon oxide, silicon nitride, silicon oxynitride, or a stack thereof. It may be preferred that the antireflection layer 20 is also formed by the plasma CVD method.

Then, in one or more embodiments, a photoresist 22 is formed on the p-type silicon layer 12. The photoresist 22 may be either positive or negative and may be preferably a positive photoresist because of ease of availability of materials and high patterning accuracy. One or more embodiments use the positive photoresist in the following manner.

Figure 5G:
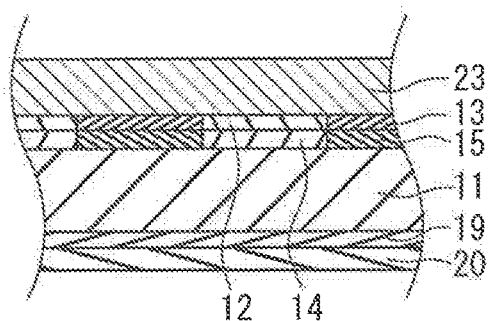
Figure 5C:
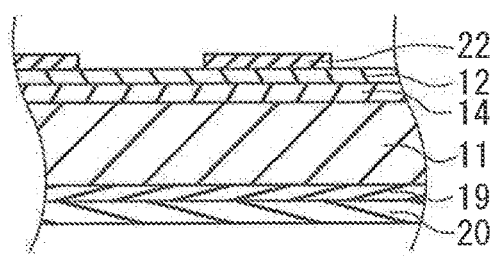

Next, as illustrated in FIG. 5C, part of the photoresist 22 is removed by exposure using a photomask (not illustrated) for forming a pattern of the p-type silicon layer 12 so that part of the p-type silicon layer 12 is exposed.

Figure 5H:
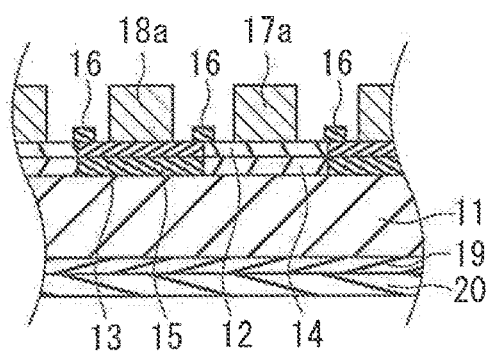
Figure 5D:
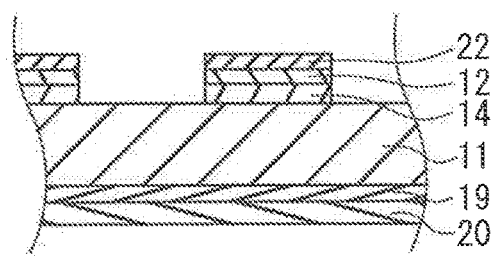

Next, as illustrated in FIG. 5D, parts of the p-type silicon layer 12 and the intrinsic silicon layer 14 are etched by using the photoresist 22 as a mask. In this case, the etchant may be preferably an acid solution containing hydrogen fluoride. The etchants suitable for each of the layers may be appropriately selected.

Figure 5I:
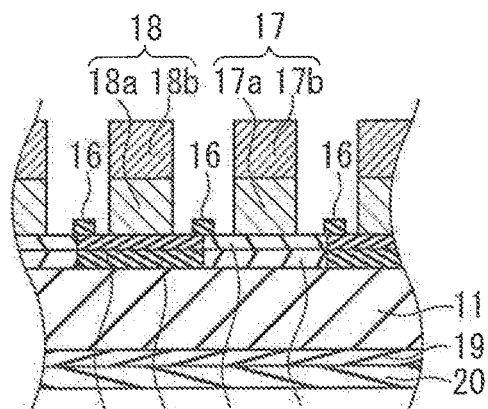
Figure 5E:
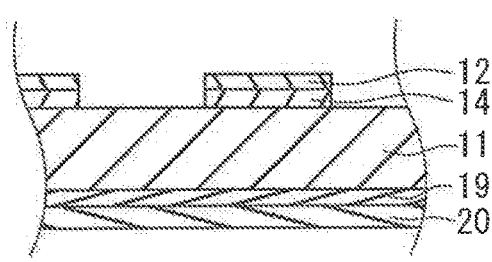

Next, as illustrated in FIG. 5E, the photoresist is peeled off. Consequently the above steps provide a region with the p-type silicon layer in which the p-type silicon layer 12 is formed, and a region without the p-type silicon layer in which the p-type silicon layer has been etched and the n-type monocrystalline silicon substrate 11 is exposed.

Next, as illustrated in FIG. 5F, an intrinsic silicon layer 15 is formed to substantially cover the region with the p-type silicon layer and the region without the p-type silicon layer. Further, an n-type silicon layer 13 is formed to substantially cover the intrinsic silicon layer 15. It may be preferred that the intrinsic silicon layer 15 and the n-type silicon layer 13 are formed by the plasma CVD method. In this case, the substrate may be preferably cleaned before the step of forming the intrinsic silicon layer 15 and the n-type silicon layer 13, and more preferably cleaned with a hydrogen fluoride aqueous solution.

Next, as illustrated in FIG. 5G the n-type silicon layer 13 and the intrinsic silicon layer 15 that are formed on the p-type silicon layer 12 are removed by etching to expose the surface of the p-type silicon layer 12. Subsequently as illustrated in FIG. 5G, a transparent conductive layer 23 is formed to cover the entire surface on the p-type silicon layer 12 and the n-type silicon layer 13. The method for forming the transparent conductive layer 23 is not particularly limited. For example, the transparent conductive layer 23 may be formed by a physical vapor phase deposition method such as sputtering or a chemical vapor phase deposition method.

Next, as illustrated in FIG. 5H, part of the transparent conductive layer 23 is removed by etching using a mask to form a first lower electrode 17a on the p-type silicon layer 12, a second lower electrode 18a on the n-type silicon layer 13, and an island-shaped conductive layer 16 between the first lower electrode 17a and the second lower electrode 18a. The concentration of the etchant and the etching time are adjusted to separate the first lower electrode 17a from the second lower electrode 18a and to form the island-shaped conductive layer 16 between these electrodes.

Finally, as illustrated in FIG. 5I, a first upper electrode 17b is formed on the first lower electrode 17a, and a second upper electrode 18b is formed on the second lower electrode 18a. The method for forming the first upper electrode 17b and the second upper electrode 18b is not particularly limited. For example, these electrodes may be formed by applying a conductive paste by a printing method.

As a result of the above steps, the back-surface electrode type solar cell of one or more embodiments are completed. In the solar cell of one or more embodiments, as illustrated in FIG. 5I, the island-shaped conductive layer 16 is disposed between the first electrode 17 and the second electrode 18. Thereby when the solar cell module is manufactured using the solar cells of the above embodiments, the shortening of the lifetime of carriers can be reduced, and the open circuit voltage and the fill factor can be improved as compared with conventional back-surface electrode type solar cells.

EXAMPLES

Hereinafter, one or more embodiments of the present invention will be described in detail by way of examples. However, the present invention is not limited to the following examples.

Example 1

<Production of Solar Cell>

A back-surface electrode type solar cell illustrated in FIG. 2 was manufactured by the steps illustrated in FIG. 5, except that an antireflection layer was not formed as described below.

First, an n-type monocrystalline silicon substrate 11 was prepared, which had the plane of incidence in the direction of (100). This substrate was first immersed in acetone and then immersed in 2% by mass of a hydrogen fluoride aqueous solution for 5 minutes so that the silicon oxide film on the surface was removed. Then, the substrate was washed two times with ultrapure water. A mixed aqueous solution containing 5% by mass of KOH and 15% by mass of isopropyl alcohol was maintained at 75° C. The above substrate was immersed in the mixed aqueous solution for 15 minutes so that the surface of the substrate was etched to form a texture. Then, the substrate was immersed in 2% by mass of a hydrogen fluoride aqueous solution for 5 minutes, washed two times with ultrapure water, and dried at normal temperature. At this stage, the surface of the n-type monocrystalline silicon substrate was observed with an atomic force microscope (AFM) manufactured by Pacific Nanotechnology, Inc. The observation confirmed that the etching on the surface of the substrate proceeded most rapidly and the (111) plane was exposed to form a pyramidal texture. An arithmetical average roughness of the surface of the substrate was 2100 nm, and the thickness of the substrate was 160 µm. The thickness of the substrate was determined by measuring a distance between the projections on the back and front surfaces of the substrate.

Next, the etched substrate was introduced into a CVD apparatus. Then, intrinsic amorphous silicon (i.e., the intrinsic silicon layer 19) with a thickness of 10 nm was formed on the light receiving surface (second principal surface) of the n-type monocrystalline silicon substrate 11. The intrinsic amorphous silicon was formed under the following conditions: the substrate temperature was 180° C.; the pressure was 130 Pa; the $SiH_4/H_2$ flow rate ratio was 2/10; and the input power density was 0.03 W/cm$^2$. The thickness of the thin film in this example was calculated from the film formation rate that was determined using a spectroscopic ellipsometry (trade name: M2000, manufactured by J. A Woollam Co., Inc.) to measure the thickness of a thin film formed on a silicon substrate under the same conditions.

Similarly, intrinsic amorphous silicon (i.e., the intrinsic silicon layer 14) with a thickness of 5 nm was formed on the back surface (first principal surface) of the n-type monocrystalline silicon substrate 11 by a CVD method. Then, p-type amorphous silicon (i.e., the p-type silicon layer 12) with a thickness of 10 nm was formed on the intrinsic silicon layer 14. The intrinsic amorphous silicon was formed under the same conditions as those on the light receiving side. The p-type amorphous silicon was formed under the following conditions: the substrate temperature was 190° C.; the pressure was 130 Pa; the $SiH_4/H_2/B_2H_6$ flow rate ratio was 1/10/3; and the input power density was 0.04 W/cm$^2$. The $B_2H_6$ gas flow rate was the flow rate of diluent gas obtained by diluting the $B_2H_6$ gas with $H_2$ until the $B_2H_6$ concentration was 5000 ppm.

The photoresist 22 was formed to substantially cover the p-type silicon layer 12. Then, part of the photoresist 22 was exposed to ultraviolet light using a photomask, developed by a KOH aqueous solution, and removed to expose the p-type silicon layer 12.

Next, using the remaining photoresist 22 as a mask, the p-type silicon layer 12 and the intrinsic silicon layer 14 were etched with a mixed acid of HF and $HNO_3$, thereby exposing the first principal surface of the n-type monocrystalline silicon substrate 11. Subsequently the photoresist 22 was peeled off and removed by using a mixed organic solvent of ethanol, acetone, and isopropyl alcohol.

Next, the substrate contaminated by etching was washed with an HF aqueous solution and introduced into the CVD apparatus. Then, intrinsic amorphous silicon (i.e., the intrinsic silicon layer 15) with a thickness of 5 nm was formed on the entire surface of the first principal surface. The intrinsic amorphous silicon was formed under the following conditions: the substrate temperature was 180° C.; the pressure was 130 Pa; the $SiH_4/H_2$ flow rate ratio was 2/10; and the input power density was 0.03 W/cm$^2$.

Next, n-type amorphous silicon (i.e., the n-type silicon layer 13) with a thickness of 10 nm was formed on the intrinsic silicon layer 15. The n-type amorphous silicon was formed under the following conditions: the substrate temperature was 180° C.; the pressure was 60 Pa; the $SiH_4/PH_3$ flow rate ratio was 1/2; and the input power density was 0.02 W/cm$^2$. The $PH_3$ gas flow rate was the flow rate of diluent gas obtained by diluting the $PH_3$ gas with $H_2$ until the $PH_3$ concentration was 5000 ppm.

The n-type silicon layer 13 and the intrinsic silicon layer 15 that were formed on the p-type silicon layer 12 were removed by etching with a KOH aqueous solution to expose the surface of the p-type silicon layer 12. Next, indium tin oxide (ITO, refractive index: 1.9) as a transparent conductive layer 23 with a thickness of 80 nm was formed by sputtering on substantially the entire surface of the first principal surface on which the p-type silicon layer 12 and the n-type silicon layer 13 were formed. The ITO was formed as a transparent conductive film under the following conditions: indium oxide to which 10% by mass of tin was added was used as a target; the substrate temperature was room temperature; the pressure was 0.2 Pa in an argon atmosphere; and the applied power density was 0.5 W/cm$^2$.

Next, part of the transparent conductive layer 23 was removed by etching with hydrochloric acid, so that the transparent conductive layer was separated as the first lower electrode 17a and the second lower electrode 18a. At this time, in order to also form the island-shaped conductive layer 16 between the first lower electrode 17a and the second lower electrode 18a, the concentration of hydrochloric acid and the immersion time were adjusted. In this embodiment, the concentration of hydrochloric acid was 20% by mass, and the immersion time in hydrochloric acid was 3 minutes.

Finally, an Ag paste was applied on the first lower electrode 17a and the second lower electrode 18a by screen printing, and thus the first upper electrode 17b and the second upper electrode 18b were formed, respectively.

The solar cell manufactured in the above manner was observed with a scanning electron microscope at 80000× magnification. The observation confirmed that the island-shaped conductive layer 16 was formed between the first electrode 17 and the second electrode 18.

Next, a solar cell module was manufactured as below using the solar cells manufactured in the above manner.

Nine solar cells were prepared. A wiring material was arranged on the first electrodes and the second electrodes of the solar cells via a conductive adhesive. The electrodes of the solar cells were connected by applying a pressure of 2 MPa for 15 seconds at a temperature of 180° C., whereby a solar cell string in which the nine solar cells were connected in series was prepared. The conductive adhesive used was a film resin containing 10% by mass of Ni powder (average particle size: about 10 μm) in a resin composed mainly of epoxy resin. The wiring material was a solder-plated copper foil in which the surface of a copper foil was coated with a solder.

Next, a solar cell module was manufactured as below using six solar cell strings prepared as described above.

First, a sealing layer was disposed on the light receiving side of the solar cell strings, and a light receiving surface protective layer was disposed on the sealing layer. The light receiving surface protective layer was a white glass plate, and the sealing material constituting the sealing layer was EVA. Next, a sealing layer was disposed on the back side of the solar cell strings in the same manner as described above, and a back surface protective layer was disposed on the sealing layer.

The back surface protective layer was composed of a black resin layer, a reflection layer, and a base layer in this order from the solar cell string side. The black resin constituting the black resin layer was polyolefin resin to which a black pigment was added. The reflection layer was an Al foil, and the base layer was a PET film.

The black resin layer absorbs visible light rays λB having wavelengths of less than 750 nm, and passes near infrared rays λA having wavelengths of 750 nm or more. The Al foil to be used as the reflection layer reflects near infrared rays λA.

Next, a stack in which the light receiving surface protective layer, the sealing layer, the solar cell strings, the sealing layer, and the back surface protective layer were stacked in this order was heated at a temperature of 150° C. under atmospheric pressure, and after the pressure was reduced to 100 Pa, the stack was pressurized by atmospheric pressure for five minutes to unite the stack. The temperature was maintained at 150° C. for 60 minutes to crosslink the EVA (sealing material). In this manner, the solar cell module as illustrated in FIG. 4 was manufactured.

Comparative Example 1

A solar cell of Comparative Example 1 was manufactured in the same manner as in Example 1 except that the etching time of the transparent conductive layer 23 using hydrochloric acid was changed to 15 minutes in the manufacturing process of the solar cell. The manufactured solar cell was observed with a scanning electron microscope at 80000× magnification. The observation confirmed that the island-shaped conductive layer was not formed between the first electrode 17 and the second electrode 18. Next, the solar cell module was manufactured using the solar cells in the same manner as in Example 1.

The photoelectric conversion properties of the solar cell modules of Example 1 and Comparative Example 1 that were manufactured in the above manner were evaluated by measuring the open circuit voltage (Voc), the short circuit current (Isc), and the fill factor (FF). Table 1 shows the results. In Table 1, the measurement results of Example 1 are expressed as a relative ratio to the corresponding values of Comparative Example 1, where each of the values is defined as 1.00.

TABLE 1

|  | Voc | Isc | FF |
| --- | --- | --- | --- |
| Example 1 | 1.04 | 1.01 | 1.02 |
| Comparative Example 1 | 1.00 | 1.00 | 1.00 |

As can be seen from Table 1, Example 1, in which the island-shaped conductive layer was formed between the first electrode and the second electrode, improved all of the properties, Voc. Isc and FF, in particular, greatly improved Voc, as compared with Comparative Example 1, in which the island-shaped conductive layer was not formed between the first electrode and the second electrode. The main reason for this is considered as follows. In Example 1, the conductive layer present like an island between the first electrode and the second electrode functioned as a cushioning material during the manufacture of the solar cell module, so that the sealing material did not contact the semiconductor layers directly. Thus, the shortening of the lifetime of carriers in the semiconductor layers was reduced.

It was confirmed from the results of Example 1 and Comparative Example 1 that the formation of the island-shaped conductive layer between the first electrode and the second electrode can prevent leakage current between the electrodes while reducing the shortening of the lifetime of carriers in the semiconductor layers, thereby improving the open circuit voltage and the fill factor.

Although the disclosure has been described with respect to only a limited number of embodiments, those skilled in the art, having benefit of this disclosure, will appreciate that various other embodiments may be devised without departing from the scope of the present invention. Accordingly the scope of the present invention should be limited only by the attached claims.

DESCRIPTION OF REFERENCE NUMERALS

10 Solar cell
11 Semiconductor substrate
12 First conductive layer
13 Second conductive layer
14, 15, 19 Junction layer
16 Island-shaped conductive layer
17 First electrode
17a First lower electrode
17b First upper electrode
18 Second electrode
18a Second lower electrode
18b Second upper electrode
20 Antireflection layer
21 Sunlight
22 Photoresist
23 Transparent conductive layer
30 Solar cell module
31 Wiring part
32 Sealing layer
33 Back surface protective layer
34 Light receiving surface protective layer
35 Sunlight

What is claimed is:

1. A solar cell, comprising:
a semiconductor substrate;
a first conductive layer;
a second conductive layer;
a first electrode;
a second electrode; and
an island-shaped conductive layer,
wherein the first conductive layer and the second conductive layer are disposed on one principal surface of the semiconductor substrate,
wherein the first conductive layer has a different conductivity type from the second conductive layer,
wherein the first electrode is disposed on the first conductive layer, and the second electrode is disposed on the second conductive layer,
wherein the first electrode and the second electrode are electrically separated,
wherein the island-shaped conductive layer is disposed between the first electrode and the second electrode, and
wherein the island-shaped conductive layer is in direct contact with at least one of the first conductive layer and the second conductive layer.

2. The solar cell according to claim 1, wherein the island-shaped conductive layer is made of a transparent conductive material.

3. The solar cell according to claim 2, wherein the transparent conductive material comprises indium oxide and at least one dopant selected from the group consisting of Sn, W, Zn, Ti, Ce, Zr, Mo, Al, Ga and Ge.

4. The solar cell according to claim 1, wherein the island-shaped conductive layer has a sheet resistance of 1.6 kΩ/square or more.

5. The solar cell according to claim 1, wherein the island-shaped conductive layer has a maximum width of 50 to 250 nm in a direction separating the first electrode and the second electrode.

6. A solar cell module, comprising:
a plurality of the solar cells according to claim 1;
a sealing layer that covers the plurality of solar cells;
a wiring part;
a light receiving surface protective layer; and
a back surface protective layer.

* * * * *